Jan. 10, 1961 P. E. MARENHOLTZ 2,968,008

SELF-STARTING MULTIVIBRATOR

Filed April 11, 1957

3 Sheets-Sheet 1

Pete E. Marenholtz,
INVENTOR.

BY [signature]
Attorney

United States Patent Office 2,968,008

Patented Jan. 10, 1961

2,968,008

SELF-STARTING MULTIVIBRATOR

Pete E. Marenholtz, San Diego, Calif., assignor to Daystrom, Incorporated, Murray Hill, N.J., a corporation of New Jersey Filed Apr. 11, 1957, Ser. No. 652,249

4 Claims. (Cl. 331—113)

The present invention relates generally to a self-starting multivibrator, and is particularly concerned with a free-running multivibrator utilizing semi-conductor devices such as transistors of the junction type.

Heretofore, self-starting free-running multivibrators utilizing transistors have been utilized for relatively low frequency operation. In the conventional circuitry, it is the usual arrangement to employ cross-coupling or connections embodying an R-C network which determines the frequency of oscillation of the multivibrator. For low frequency operation, the components of the R-C network are of such values that relatively small base currents flow, and any small electrical disturbance in each base circuit will produce a signal on the corresponding collector, so that there will be a signal transfer through the capacitor to the alternate base and regeneration will continue and oscillation start.

When it is attempted to operate the conventional multivibrators at relatively higher frequencies, the components of the R-C networks must be reduced to such small values that greater base currents occur, and the transfer of energy through the capacitors is decreased to such an extent that starting is unreliable. In this state, the transistors have little or no gain, and when voltages are applied both transistors go into a condition of saturation.

There are installations where the use of self-starting multivibrators utilizing transistors are particularly desirable, for example, in the field of computors. In these applications, attempts to operate the conventional multivibrators at frequencies of the order of 100 kc. have been unsuccessful for the reasons stated above.

Having in mind the inherent disadvantages of the presently known multivibrators utilizing transistors, it is one object of the present invention to provide a free-running, self-starting, multivibrator including two primary transistors, which will operate at frequencies of the order of 100 kc.

It is a further object of the invention to provide such a multivibrator for high frequency operation, wherein a condition of saturation of both transistors is prevented, and self-starting assured.

A further object is to provide a multivibrator of the above type, wherein the transistors are isolated from loading effects of the cross-connection network and external circuits.

Another object is to provide in multivibrators of the above noted type, for operation at high frequency, an arrangement wherein the base return resistors are connected to points which follow the collector potentials.

Still another object is to provide a high frequency operation multivibrator, wherein the R-C network capacitor discharge current is conducted to a point of negative potential through a path independent of the collector return resistor.

A still further object is to provide a multivibrator wherein the collector fall time of the primary transistors is decreased, thus permitting operation of the multivibrator at higher frequencies.

Further objects of the invention will be brought out in the following part of the specification, wherein detailed description is for the purpose of fully disclosing the invention without placing limitations thereon.

Referring to the accompanying drawings, which are for illustrative purposes only:

Figure 1:
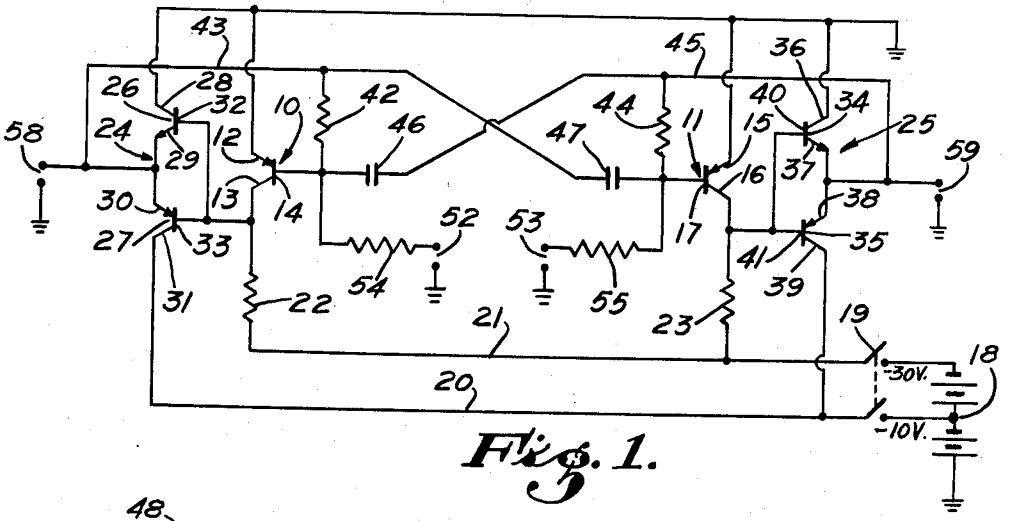
Fig. 1 is a circuit diagram of a free-running multivibrator circuit embodying the present invention.

Referring now to the drawings, in which like components have been designated by the same reference numerals throughout the figures, and particularly to Fig. 1, there is illustrated a free-running multivibrator circuit embodying the features of the present invention. The multivibrator utilizes two main or primary semi-conductor devices, such as the transistors as generally indicated at 10 and 11. These transistors are of the type generally known as the junction type.

The transistor 10 has an emitter electrode 12, a collector electrode 13 and a base electrode 14; while the transistor 11 correspondingly has an emitter electrode 15, a collector electrode 16 and a base electrode 17.

The multivibrator is supplied with energy from a supply source in the form of a battery 18 having its positive terminal grounded. Fixed points of negative potential of the battery are respectively connected through a switch 19 with conductors 20 and 21 and respectively place negative potentials of 10 volts and 30 volts respectively upon these conductors. The positive side of the potential source is connected with the emitter electrodes 12 and 15 respectively, and the collector electrodes 13 and 16 of the transistors are respectively connected through resistors 22 and 23 to the negative potential conductor 21. Transistor control networks, as generally indicated by the numerals 24 and 25, are respectively associated with the main or primary transistors 10 and 11. The network 24 includes current control members such as an n-p-n transistor 26 and a p-n-p transistor 27. The transistor 26 has a collector electrode 28 connected with the positive terminal of the battery 18, and an emitter electrode 29 which is connected in series with an emitter electrode 30 of transistor 27. A collector electrode 31 of transistor 27 connects with the minus 10 volt point of potential on conductor 20. Base electrodes 32 and 33 of the respective transistors 26 and 27 are connected with the collector electrode 13 of the transistor 10.

In a similar manner, transistor control network 25 contains current control members such as transistors 34 and 35 having a collector electrode 36, emitter electrode 37, emitter electrode 38, collector electrode 39, and base electrodes 40 and 41 respectively.

According to the present invention, the base electrode of the primary transistor 10 is connected through a base return resistor 42 and conductor 43 to the interconnection between the emitter electrodes 29 and 30 of the emitter follower network 24. In a similar manner, the base electrode 17 is connected through a base return resistor 44 and conductor 45 with the interconnection between the emitter electrode 37 and emitter electrode 38 of the emitter follower network 25.

Cross-coupling or connection between the primary transistors 10 and 11 is obtained by connecting the base electrode 14 of transistor 10 through a capacitor 46 with conductor 45, and the base electrode 17 of transistor 11 through a capacitor 47 with conductor 43.

Figure 2:
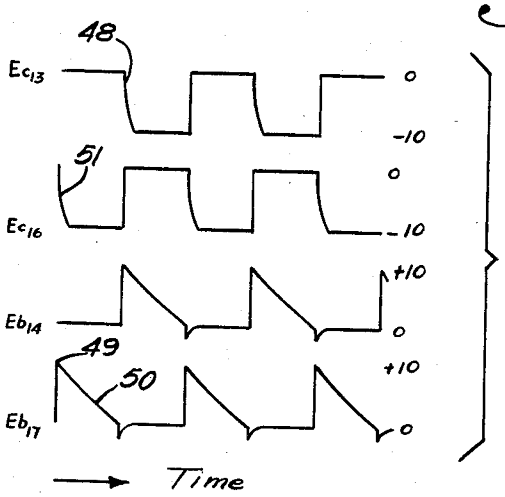
Fig. 2 is a graph illustrating the voltages at the base and collector electrodes of the transistors utilized in the circuit arrangement of Fig. 1.

The operation of the self-starting, free-running multivibrator circuit as shown in Fig. 1 will be best understood by reference to the graphs shown in Fig. 2 of the collector and base electrode voltages of the primary transistors 10 and 11.

Considering in detail the operation, let it now be assumed that the transistor 10 starts conducting. Flow of current through emitter electrode 12, collector 13 and resistor 22 causes a potential drop across the resistor which will cause the potential of the collector electrode 13 to go from minus 10 volts to ground or zero potential as indicated by the curve portion 48, Fig. 2. The capacitor 47 having been previously charged through a charging path from ground, through emitter electrode 15 and base electrode 17 of transistor 11, to one side of capacitor 47, from the other side of the capacitor through emitter 30 and collector 31 of transistor 27, to conductor 20, will now have a residual charge of zero to minus 10 volts. Due to the above mentioned increase in the potential of collector electrode 13, the capacitor 47 will now be caused to rapidly increase its charged potential level, by reason of a path from the collector electrode 13, base electrode 32 of transistor 26, emitter electrode 29, and thence through conductor 43 to one side of capacitor 47, so that the voltage of the base electrode 17 of transistor 11 will be increased from zero or ground to plus 10 volts as indicated at 49, Fig. 2. The positive voltage appearing on the base electrode 17 causes transistor 11 to cut off, and with no current flow therethrough, the capacitor 47 will discharge in a path from one side of the capacitor, through resistor 44, emitter 38 and collector 39 of transistor 35 to the minus 10 volt terminal of the battery 18, from the positive terminal of the battery through ground, collector 28 and emitter 29 of transistor 26, thence through conductor 43 back to the other side of capacitor 47. It will be observed that most of the discharge current flows from the collector 28 to the emitter 29 with only a relatively small amount from the base 32 of transistor 26 to its emitter 29. Thus, the discharge current of capacitor 47 does not load the collector electrode 13 of the transistor 10. As the capacitor 47 discharges, as explained above, the voltage of the base electrode 17 decreases exponentially according to the curve 50 shown in Fig. 2.

It will also be appreciated that when the transistor 11 cuts off, the voltage of the collector electrode 16 goes from zero or ground to minus 10 volts as indicated by the curve portion 51, as shown in Fig. 2. Although the collector electrodes are connected through collector resistors to the minus 30 volt terminal of the battery, the collector voltage swing will be clamped between ground and minus 10 volts because of the collector to base diode action of the transistors 27 and 35, when the primary transistors are cut off. By returning the collector electrodes of the primary transistors 10 and 11 to the minus 30 volt terminal of the battery, a shorter fall time is obtained in going to the minus 10 volt potential, since the latter forms only a portion of the entire exponential curve.

When the potential of the base electrode 17 reaches a potential just slightly less than ground or zero, transistor 11 starts conducting and current will flow through resistor 23. Due to the potential drop across resistor 23, the potential of the collector electrode 16 will go from minus 10 volts to ground or zero, and as a consequence the potential of the base electrode 14 of the transistor 10 will go from ground to plus 10 volts, and cut off transistor 10 in the manner previously described for transistor 11. Oscillation thus continues with the transistors 10 and 11 being alternately cut on and cut off.

Figure 3:
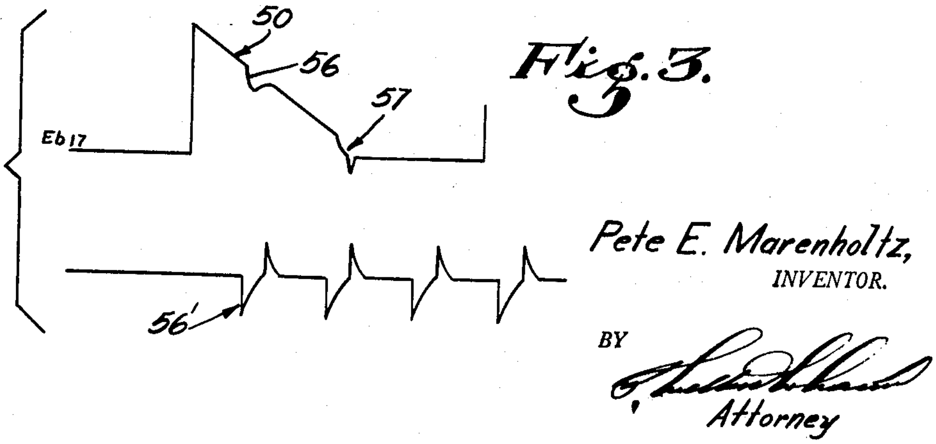
Fig. 3 is a graph illustrating the effect of an applied negative pulse on the voltage of a transistor base electrode.

The multivibrator of the present invention may be synchronized by externally applied triggering pulses in the form of a synchronizing sine wave or suitable negative pulses. These pulses may be impressed on input terminals 52 or 53. One of the input terminals is grounded, while the other terminal connects through a resistor 54 to the base electrode 14 of transistor 10, or through a resistor 55 to the base electrode 17 of the transistor 11. As shown in Fig. 3, the triggering pulses, as indicated at 56 will be impressed at input terminals. Because of the integrating effect of capacitors 46 or 47 the voltage decay curve 50 of the base electrode will be modified as shown at 56'. Thus, when the voltage of the base electrode reaches a point where the voltage portion 56' intercepts the ground or zero voltage line, as indicated by the numeral 57, a salient starting point for conduction of transistor 11, or the transistor 10, as the case may be, will be established.

Multivibrator output may be taken from output terminals 58 or 59. For push-pull operation, output may be taken from both of these terminals. One of the output terminals connects with ground while the other is connected with the emitters of the transistor control networks respectively associated with the transistor 10 and transistor 11.

Various modifications may suggest themselves to those skilled in the art without departing from the spirit of my invention, and, hence, I do not wish to be restricted to the specific form shown or uses mentioned, except to the extent indicated in the appended claims.

I claim:

1. A free-running multivibrator circuit, comprising: a first and second primary transistor, each having base, emitter and collector electrodes; a source of supply potential; a first pair of resistors connected individually in circuit between each of said collector electrodes and a fixed point of potential of said source; a control transistor network associated with each of said primary transistors, each of said networks including a pair of transistors having their emitter-collector electrode circuits connected in series to said supply potential, and their base electrodes connected to the collector electrode of the associated primary transistor; and connections respectively between the base electrode of each primary transistor and the emitters of each transistor control network, one of said connections containing a resistor and the other a capacitor.

2. A free-running multivibrator circuit, comprising: a first and second primary transistor, each having base, emitter and collector electrodes; a source of supply potential; a first pair of resistors connected individually in circuit between each of said collector electrodes and a fixed point of potential of said source; a transistor control network associated with each of said primary transistors, each of said networks including an n-p-n transistor and a p-n-p transistor having their emitter-collector circuits connected in series to said supply potential, and their base electrodes connected to the collector electrode of the associated primary transistor; and connection respectively between the base electrode of each primary transistor and the emitters of each transistor control network, one of said connections containing a resistor and the other a capacitor.

3. A free-running multivibrator including first, second, third, fourth, fifth and sixth semiconductors each having a base, an emitter and a collector, the bases of the third and fourth semiconductors each being electrically coupled to the collector of said first semiconductor, a potential source having first, second, and third output terminals, the emitter of each of said first and second semiconductors being connected to said first output terminal, first and second impedance means each connected between a different one of the collectors of said first and second semiconductors and said third terminal, the collectors of said third and fourth semiconductors each being connected to a different one of said first and second output terminals, the bases of said fifth and sixth semiconductors each being electrically coupled to the collector of said second semiconductor, the collectors of said fifth and sixth semiconductors each being connected to a different one of said first and second output terminals, a first reactance means coupled between the emitters of said third and fourth semiconductors and the base of said second semiconductor, a second reactance means coupled between the emitters of said fifth and sixth semiconductors and the base of said first semiconductor, a first resistance means coupled between the emitters of said third and fourth semiconductors and the base of said first semiconductor, and a second resistance means coupled between the emitters of said fifth and sixth semiconductors and the base of said second semiconductor.

4. The multivibrator set forth in claim 3 in which the potential available at said third output terminal is greater in magnitude than the potential at said first and second terminals, whereby to increase the frequency of response of the multivibrator.

References Cited in the file of this patent

UNITED STATES PATENTS

| | | |
|---|---|---|
| 2,651,722 | Bergfors | Sept. 8, 1953 |
| 2,744,198 | Raisbeck | May 1, 1956 |
| 2,838,675 | Wanlass | June 10, 1958 |
| 2,846,583 | Goldfischer et al. | Aug. 5, 1958 |
| 2,850,630 | Prugh | Sept. 2, 1958 |